United States Patent
Hishida et al.

(10) Patent No.: US 8,315,097 B2
(45) Date of Patent: Nov. 20, 2012

(54) NONVOLATILE SEMICONDUCTOR MEMORY DEVICE

(75) Inventors: Tomoo Hishida, Yokohama (JP); Hitoshi Iwai, Kamakura (JP); Yoshihisa Iwata, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 125 days.

(21) Appl. No.: 13/026,616

(22) Filed: Feb. 14, 2011

(65) Prior Publication Data

US 2012/0069655 A1  Mar. 22, 2012

(30) Foreign Application Priority Data

Sep. 21, 2010  (JP) .................................. 2010-211293

(51) Int. Cl.
  *G11C 11/34* (2006.01)

(52) U.S. Cl. ............. 365/185.17; 365/185.25; 365/183; 365/185.05

(58) Field of Classification Search ............. 365/185.17, 365/185.25, 183, 185.05
See application file for complete search history.

(56) References Cited

U.S. PATENT DOCUMENTS

2002/0181303 A1* 12/2002 Kato et al. .................... 365/200

FOREIGN PATENT DOCUMENTS

| JP | 8-255498 | 10/1996 |
|----|----------|---------|
| JP | 2007-266143 | 10/2007 |

* cited by examiner

*Primary Examiner* — Jason Lappas
(74) *Attorney, Agent, or Firm* — Oblon, Spivak, McClelland, Maier & Neustadt, L.L.P.

(57) ABSTRACT

A memory string is configured by a plurality of memory transistors and a spare memory transistor connected in series. Word lines are connected to gates of the memory transistors. A spare word line is connected to a gate of the spare memory transistor. The memory string comprises a first semiconductor layer, a charge storage layer, a plurality of first conductive layers, and a second conductive layer. The first semiconductor layer extends in a perpendicular direction with respect to a substrate. The charge storage layer surrounds a side surface of the first semiconductor layer. The plurality of first conductive layers surround a side surface of the first semiconductor layer with the charge storage layer interposed therebetween, and function as the word lines. The second conductive layer surrounds a side surface of the first semiconductor layer with the charge storage layer interposed therebetween, and functions as the spare word line.

20 Claims, 17 Drawing Sheets

Row Direction Cross-Sectional View

Column Direction Cross-Sectional View

Row Direction Cross-Sectional View

Column Direction Cross-Sectional View

NONVOLATILE SEMICONDUCTOR MEMORY DEVICE

CROSS-REFERENCE TO RELATED APPLICATIONS

This application is based upon and claims the benefit of priority from the prior Japanese Patent Application No. 2010-211293, filed on Sep. 21, 2010, the entire contents of which are incorporated herein by reference.

FIELD

Embodiments described in this specification relate to an electrically data-rewritable nonvolatile semiconductor memory device.

BACKGROUND

In recent years, many semiconductor memory devices having memory transistors (memory cells) disposed three-dimensionally (three-dimensional semiconductor memory devices) are proposed to increase the degree of integration of memory. For example, a conventional three-dimensional semiconductor memory device includes a columnar semiconductor layer extending in a perpendicular direction with respect to a substrate, and a conductive layer surrounding the columnar semiconductor layer with a charge storage layer interposed therebetween. The columnar semiconductor layer functions as a body of a memory transistor. In addition, the conductive layer functions as a gate of the memory transistor and as a word line connected to the memory transistor.

In a three-dimensional semiconductor memory device of the kind described above, when adjacent word lines short-circuit, problems arise in operation of all memory transistors connected to those word lines.

DETAILED DESCRIPTION

A nonvolatile semiconductor memory device in accordance with an embodiment comprises a memory string, word lines, a spare word line, and a control circuit. The memory string is configured by a plurality of memory transistors and a spare memory transistor connected in series, the memory transistors and the spare memory transistor being electrically rewritable. The word lines are connected to gates of the memory transistors. The spare word line is connected to a gate of the spare memory transistor. The control circuit controls a voltage supplied to the memory string. The memory string comprises a first semiconductor layer, a charge storage layer, a plurality of first conductive layers, and a second conductive layer. The first semiconductor layer extends in a perpendicular direction with respect to a substrate and functions as a body of the memory transistors and as a body of the spare memory transistor. The charge storage layer is formed to surround a side surface of the first semiconductor layer. The plurality of first conductive layers are formed to surround a side surface of the first semiconductor layer with the charge storage layer interposed therebetween, and function as the gates of the memory transistors and as the word lines. The second conductive layer is formed to surround a side surface of the first semiconductor layer with the charge storage layer interposed therebetween, and functions as the gate of the spare memory transistor and as the spare word line. The control circuit is capable of driving the spare word line in place of the word lines.

Next, embodiments of a nonvolatile semiconductor memory device are described with reference to the drawings.

[First Embodiment]

[Configuration]

Figure 1:
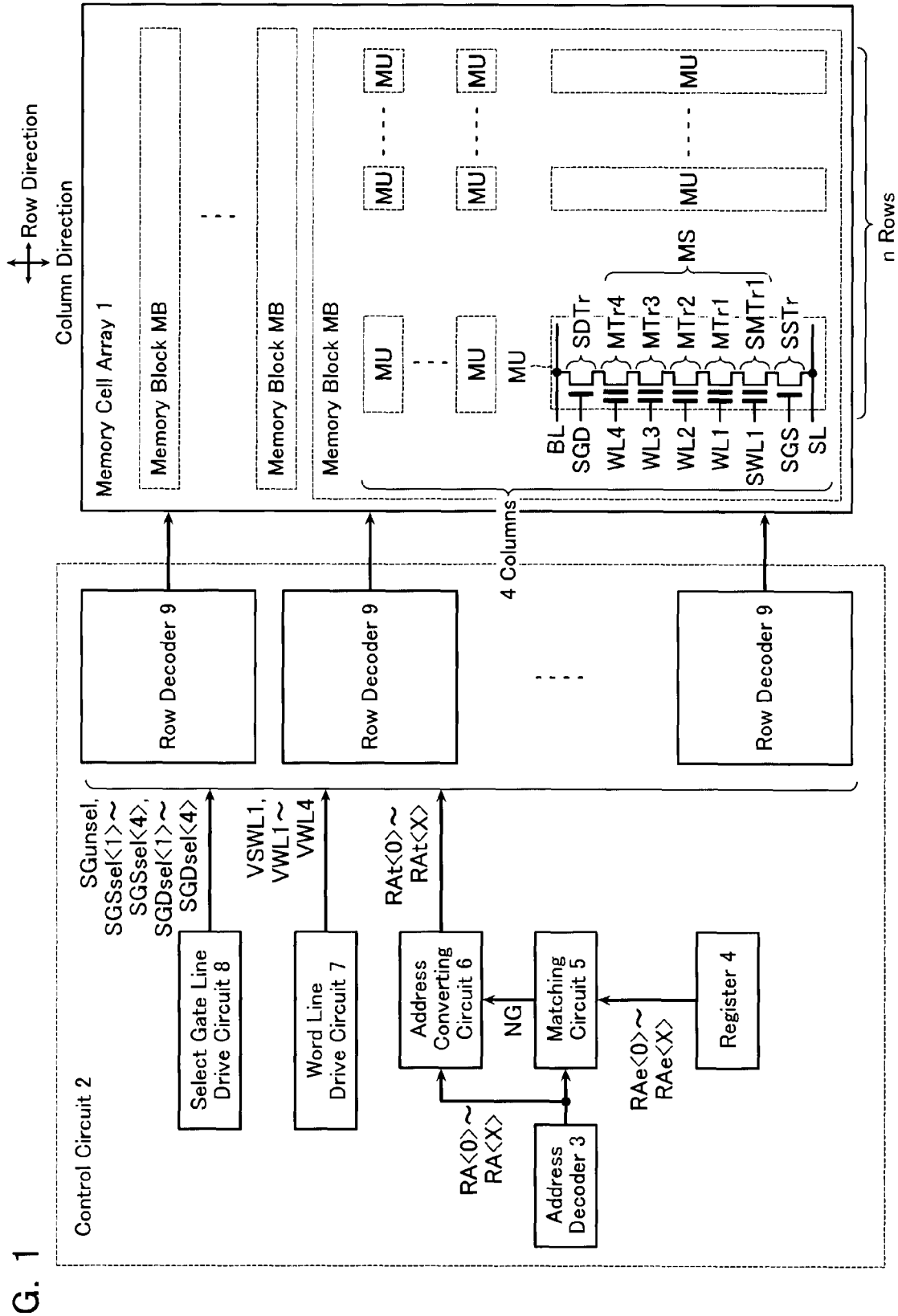
FIG. 1 is a block diagram of a nonvolatile semiconductor memory device in accordance with a first embodiment.

First, a configuration of a nonvolatile semiconductor memory device in accordance with a first embodiment is described with reference to FIG. 1. FIG. 1 is a block diagram of the nonvolatile semiconductor memory device in accordance with the first embodiment.

Figure 3:
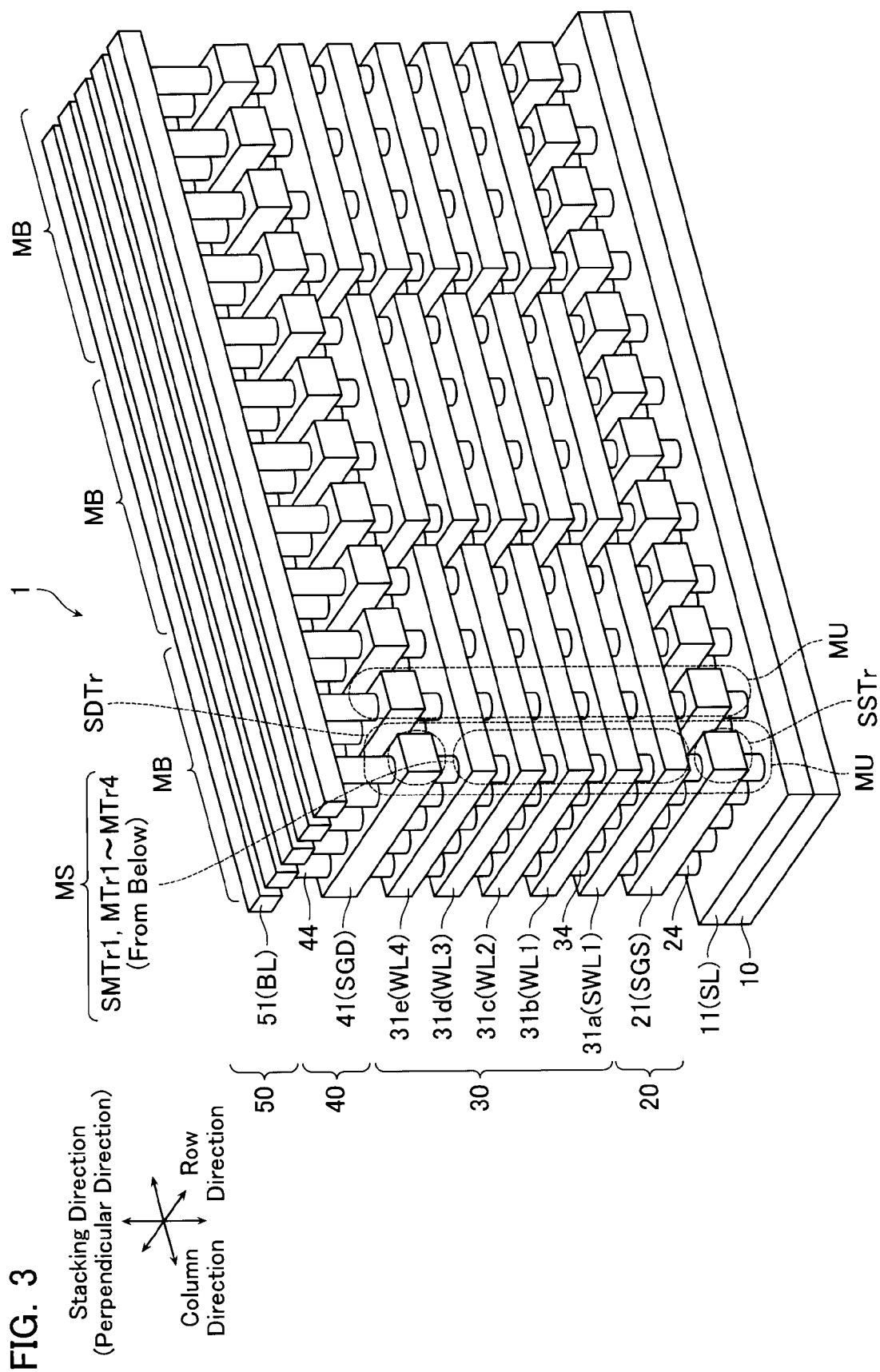
FIG. 3 is a schematic perspective view of a memory cell array 1 in accordance with the first embodiment.

As shown in FIG. 1, the nonvolatile semiconductor memory device in accordance with the first embodiment includes a plurality of memory blocks MB, each of the memory blocks MB configuring a unit for erasing data. Each of the memory blocks MB includes a plurality of memory units MU. Furthermore, each of the memory units MU includes a memory string MS, a source side select transistor, SSTr, and a drain side select transistor SDTr. The memory units MU are disposed in a matrix in a row direction and a column direction. In the example shown in FIG. 1, one memory block MB has n rows of memory units MU provided in the row direction and four columns of memory units MU provided in the column direction. Note that, as shown in FIG. 3 later described, the memory units MU are disposed having a stacking direction (a perpendicular direction with respect to a semiconductor substrate 10) as a long direction. That is, the memory units MU are disposed three-dimensionally.

As shown in FIG. 1, the memory string MS is configured by memory transistors MTr1-MTr4 and a spare memory transistor SMTr1 connected in series. When the memory transistors MTr1-MTr4 works properly, a read operation, write operation, and erase operation of data is executed on those memory transistors MTr1-MTr4.

When any one of the memory transistors MTr1-MTr4 does not work properly, the various operations are executed on the spare memory transistor SMTr1 in place of on the one of the memory transistors MTr1-MTr4 that does not work properly. The memory transistors MTr1-MTr4 and the spare memory transistor SMTr1 store data by storing a charge in their respective charge storage layers.

Connected to gates of the memory transistors MTr1-MTr4 are word lines WL1-WL4. Connected to a gate of the spare memory transistor SMTr1 is a spare word line SWL1.

The source side select transistor SSTr has its drain connected to a source of the memory string MS (source of the spare memory transistor SMTr1). Connected to a gate of the source side select transistor SSTr is a source side select gate line SGS. The source side select transistor SSTr has its source connected to a source line SL.

The drain side select transistor SDTr has its source connected to a drain side of the memory string MS (drain of the memory transistor MTr4). Connected to a gate of the drain side select transistor SDTr is a drain side select gate line SGD. The drain side select transistor SDTr has its drain connected to a bit line BL.

When there is no defect in the word lines WL1-WL4, the control circuit 2 drives those word lines WL1-WL4. On the other hand, when any one of the word lines WL1-WL4 is defective, the control circuit 2 drives the spare word line SWL1 in place of that one of the word lines WL1-WL4. The control circuit 2 includes an address decoder 3, a register 4, a matching circuit 5, an address converting circuit 6, a word line drive circuit 7, a select gate line drive circuit 8, and a plurality of row decoders 9.

The address decoder 3 outputs address signals RA<0>-RA<X>. The address signals RA<0>-RA<X> specify a selected memory block MB and selected word lines WL1-WL4 when the various operations are executed. The register 4 stores defect address signals RAe<0>-RAe<X>. The defect address signals RAe<0>-RAe<X> specify a memory block MB having a defect and word lines WL1-WL4 having a defect.

The matching circuit 5 receives the address signals RA<0>-RA<X> and the defect address signals RAe<0>-RAe<X>. Further, when these two match, the matching circuit 5 outputs a matching signal NG.

The address converting circuit 6 outputs address signals RAt<0>-RAt<X> based on the address signals RA<0>-RA<X> and the matching signal NG. The address signals RAt<0>-RAt<X> include an address specifying the spare word line SWL1 to act as a substitute for the any one of the word lines WL1-WL4 found defective. In this case, for example, the address of word line WL1 judged to be defective is interchanged with the address of the spare word line SWL1. Alternatively, the address of the word lines WL2-WL4 and the spare word line SWL1 are reallocated, while the word line WL1 judged to be defective is excluded.

The word line drive circuit 7 supplies a voltage VSWL1 to the spare word line SWL1 via the row decoders 9. The word line drive circuit 7 supplies voltages VWL1-VWL4 to the word lines WL1-WL4 via the row decoders 9.

The select gate line drive circuit 8 supplies a voltage SGunsel, voltages SGSsel<1>-<4>, and voltages SGDsel<1>-<4>, via the row decoders 9. The voltage SGunsel is supplied to the source side select gate line SGS and the drain side select gate line SGD included in an unselected memory block MB. The voltages SGSsel<1>-<4> are supplied, respectively, to source side select gate lines SGS<1>-<4> positioned in the first through fourth columns included in a selected memory block MB. The voltages SGDsel<1>-<4> are supplied, respectively, to drain side select gate lines SGD<1>-<4> positioned in the first through fourth columns included in a selected memory block MB.

The row decoders 9 drive the word lines WL1-WL4 and spare word line SWL1 specified by the address signals RAt<0>-RAt<X>, the source side select gate line SGS, and the drain side select gate line SGD.

Next, various wirings in the memory block MB are described with reference to FIG. 2. As mentioned above, the memory block MB includes a plurality of memory units MU. Moreover, each of the memory units MU includes a memory string MS (the memory transistors MTr1-MTr4 and spare memory transistor SMTr1), a source side select transistor SSTr, and a drain side select transistor SDTr.

Figure 2:
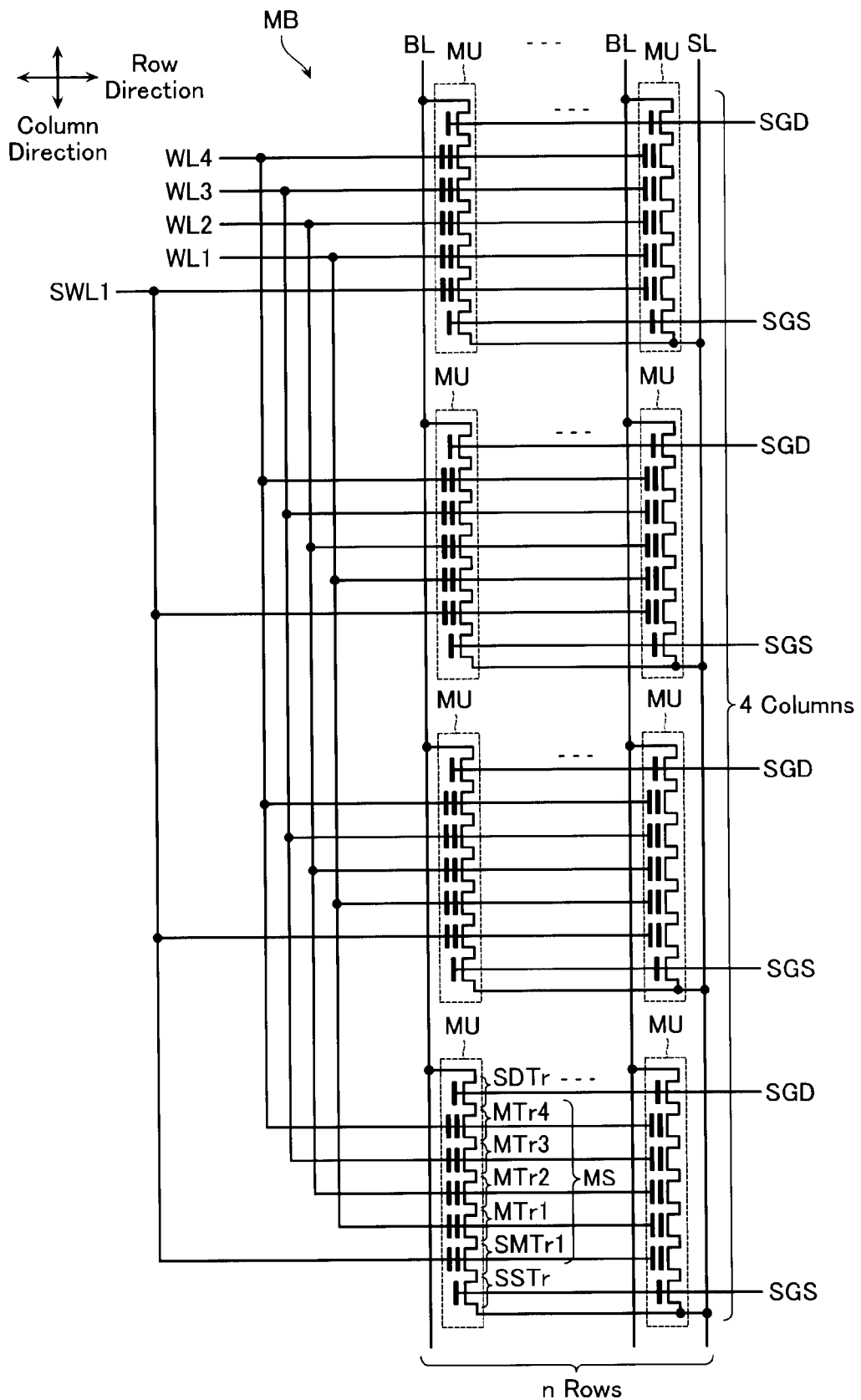
FIG. 2 is a circuit diagram of a memory cell block MB in accordance with the first embodiment.

As shown in FIG. 2, the sources (sources of the source side select transistors SSTr) of all of the memory units MU (n×4) in the memory block MB are commonly connected to one source line SL.

The drains (drains of the drain side select transistors SDTr) of four memory units MU aligned in one column in the column direction are connected to one bit line BL. There are n bit lines BL provided in one memory block MB. The bit lines BL are formed extending in the column direction and having a certain pitch in the row direction.

As shown in FIG. 2, the word lines WL1-WL4 are commonly connected, respectively, to the gates of the memory transistors MTr1-MTr4 in all of the memory units (n×4) in the memory block MB. That is, only one each of the word lines WL1-WL4 is provided to one memory block MB.

In addition, as shown in FIG. 2, the spare word line SWL1 is commonly connected to the gates of all of the spare memory transistors SMTr1 (n×4) in the memory block MB. That is, only one spare word line SWL1 is provided to one memory block MB.

The source side select gate line SGS is commonly connected to the gates of the n source side select transistors SSTr aligned in one row in the row direction. That is, in the example shown in FIG. 2, four source side select gate lines SGS are provided to one memory block MB.

The drain side select gate line SGD is commonly connected to the gates of the n drain side select transistors SDTr aligned in one row in the row direction. That is, in the example shown in FIG. 2, four drain side select gate lines SGD are provided to one memory block MB.

Figure 4A:
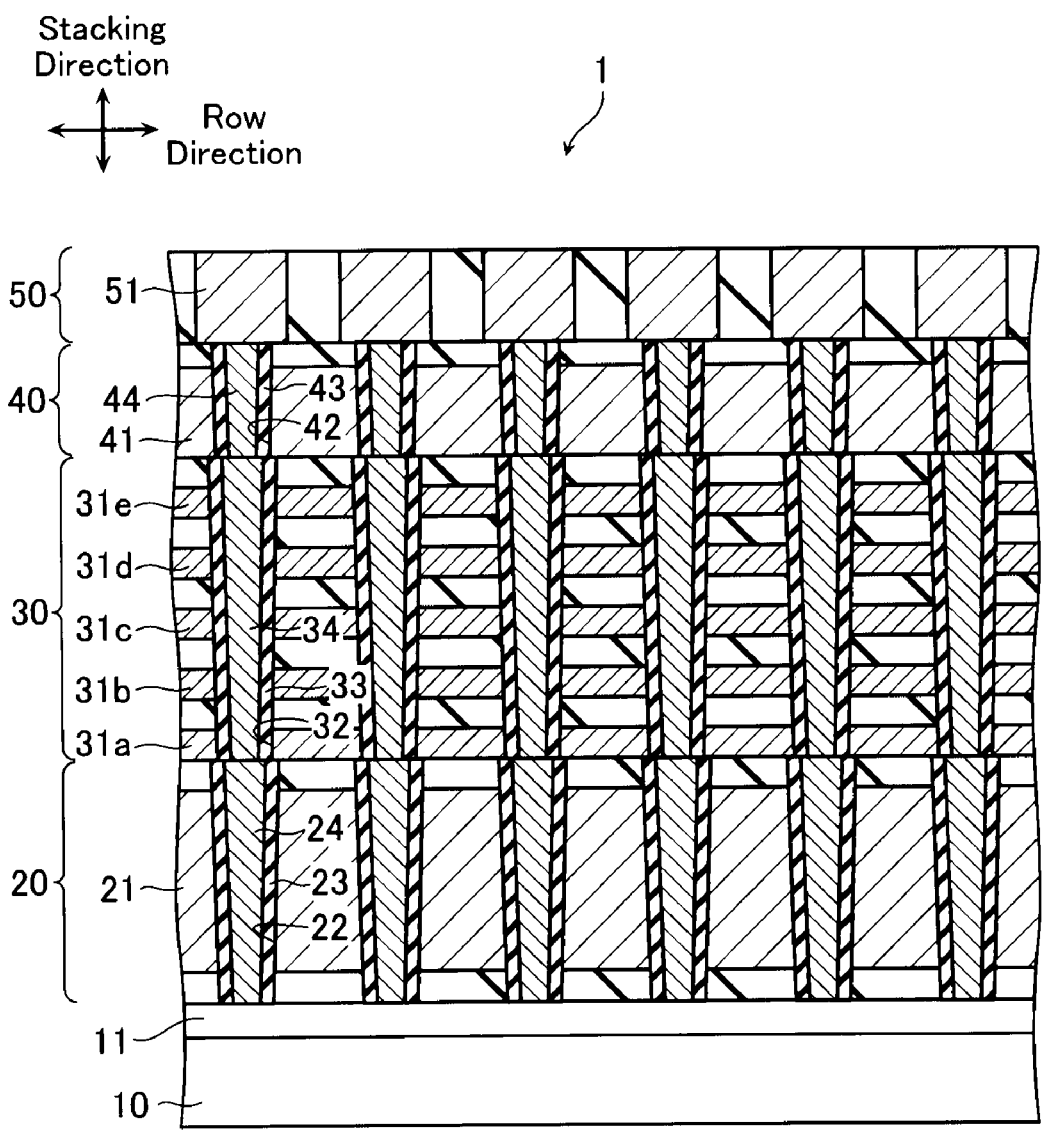
FIG. 4A is a cross-sectional view of the memory cell array 1 in accordance with the first embodiment.
Figure 4B:
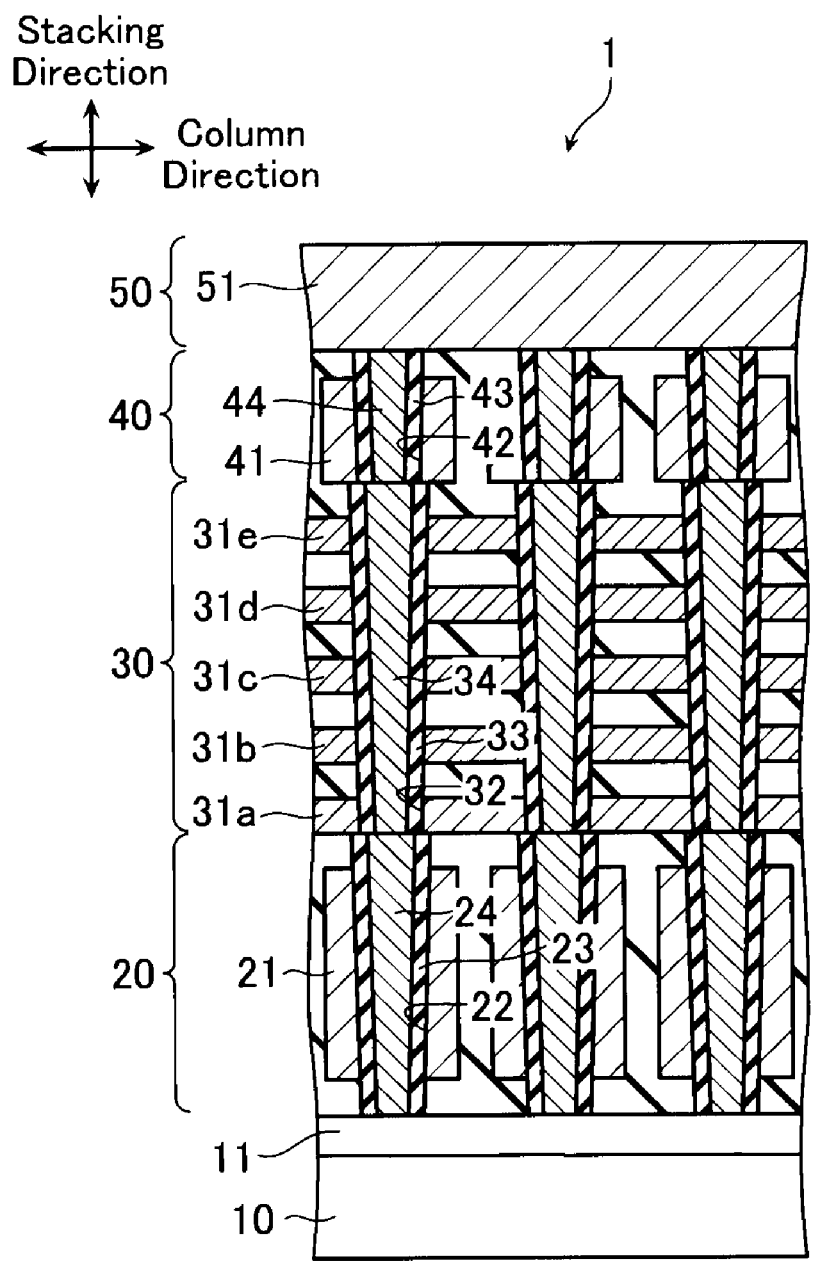
FIG. 4B is a cross-sectional view of the memory cell array 1 in accordance with the first embodiment.

Next, a stacking structure in a memory cell array 1 in accordance with the first embodiment is described with reference to FIGS. 3, 4A, and 4B. As shown in FIGS. 3, 4A, and 4B, the memory cell array 1 includes a semiconductor substrate 10, and, stacked sequentially on the semiconductor substrate 10, a source side select transistor layer 20, a memory layer 30, a drain side select transistor layer 40, and a wiring layer 50.

The source side select transistor layer 20 functions as the source side select transistor SSTr. The memory layer 30 functions as the memory string MS (spare memory transistor SMTr1 and memory transistors MTr1-MTr4). The drain side select transistor layer 40 functions as the drain side select transistor SDTr. The wiring layer 50 functions as the bit line BL, and as various other wirings.

The semiconductor substrate 10 includes a diffusion layer 11 in its upper surface. The diffusion layer 11 functions as the source line SL.

The source side select transistor layer 20 includes a source side conductive layer 21 disposed on the semiconductor substrate 10 via an insulating layer, as shown in FIGS. 3, 4A, and 4B. The source side conductive layer 21 functions as the gate of the source side select transistor SSTr and as the source side select gate line SGS. The source side conductive layer 21 is formed in stripes in each of the memory blocks MB, the stripes extending in the row direction and having a certain pitch in the column direction. The source side conductive layer 21 is configured by polysilicon (poly-Si) doped with an impurity.

In addition, as shown in FIGS. 4A and 4B, the source side select transistor layer 20 includes a source side gate insulating layer 23 and a source side columnar semiconductor layer 24. The source side columnar semiconductor layer 24 functions as a body (channel) of the source side select transistor SSTr.

The source side gate insulating layer 23 is formed with a certain thickness on a side wall of a source side hole 22. The source side columnar semiconductor layer 24 is formed to be in contact with a side surface of the source side gate insulating layer 23 and to fill the source side hole 22. The source side columnar semiconductor layer 24 is formed to be electrically connected to the diffusion layer 11. The source side gate insulating layer 23 is configured by silicon oxide ($SiO_2$). The source side columnar semiconductor layer 24 is configured by polysilicon (poly-Si).

Expressing the above-described configuration of the source side select transistor layer 20 in other words, the source side conductive layer 21 is formed to surround the source side columnar semiconductor layer 24 with the source side gate insulating layer 23 interposed therebetween.

The memory layer 30 includes word line conductive layers 31a-31e stacked sequentially on the source side select transistor layer 20 with insulating layers interposed therebetween, as shown in FIGS. 3, 4A, and 4B. The word line conductive layer 31a functions as the gate of the spare memory transistor SMTr1 and as the spare word line SWL1. The word line conductive layers 31b-31e function, respectively, as the gates of the memory transistors MTr1-MTr4 and as the word lines WL1-WL4.

The word line conductive layers 31a-31e are divided on a memory block MB basis, and formed to extend two-dimensionally in the row direction and the column direction (in a plate-like shape). The word line conductive layers 31a-31e are configured by polysilicon (poly-Si) doped with an impurity.

In addition, as shown in FIGS. 4A and 4B, the memory layer 30 includes a memory hole 32. The memory hole 32 is formed to penetrate the word line conductive layers 31a-31e. The memory holes 32 are formed in a matrix in the row direction and the column direction. The memory hole 32 is formed at a position aligning with the source side hole 22.

Further, as shown in FIGS. 4A and 4B, the memory layer 30 includes a memory gate insulating layer 33 and a memory columnar semiconductor layer 34. The memory columnar semiconductor layer 34 functions as a body (channel) of the spare memory transistor SMTr1, and as a body (channel) of the memory transistors MTr1-MTr4.

The memory gate insulating layer 33 is formed with a certain thickness on a side wall of the memory hole 32. The memory columnar semiconductor layer 34 is formed to be in contact with a side surface of the memory gate insulating layer 33 and to fill the memory hole 32. The memory columnar semiconductor layer 34 is formed in a column shape extending in the stacking direction. The memory columnar semiconductor layer 34 is formed having its lower surface in contact with an upper surface of the source side columnar semiconductor layer 24.

Figure 5:
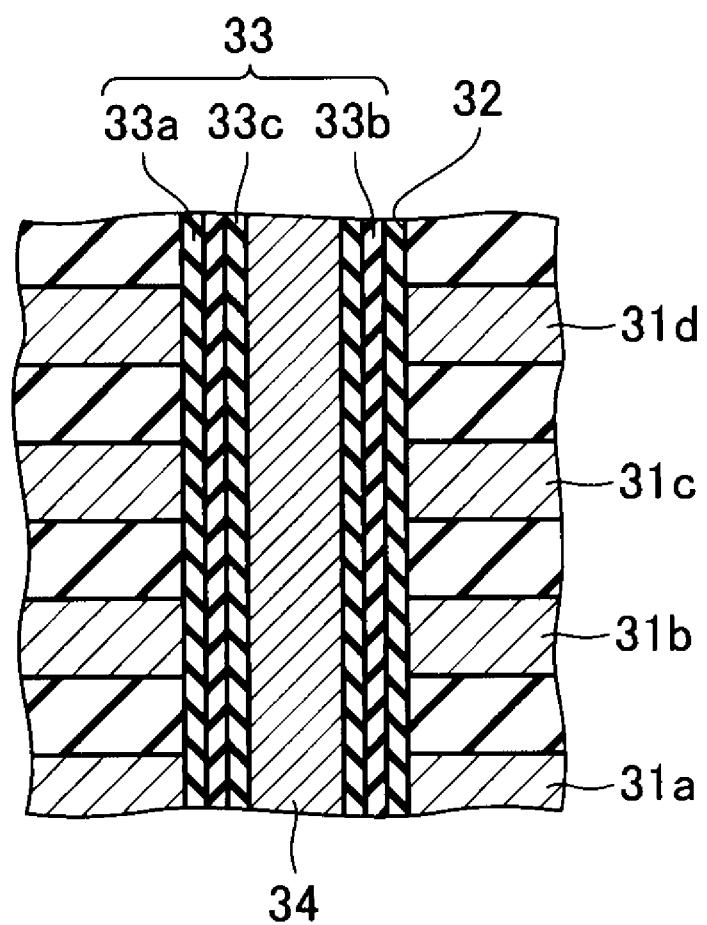
FIG. 5 is an enlarged view of FIG. 4A.

A configuration of the memory gate insulating layer 33 is now described in detail with reference to FIG. 5. FIG. 5 is an enlarged view of FIG. 4A. The memory gate insulating layer 33 includes, from a side surface of the memory hole 32 side to a memory columnar semiconductor layer 34 side, a block insulating layer 33a, a charge storage layer 33b, and a tunnel insulating layer 33c. The charge storage layer 33b is configured to be capable of storing a charge.

As shown in FIG. 5, the block insulating layer 33a is formed with a certain thickness on a side wall of the memory hole 32. The charge storage layer 33b is formed with a certain thickness on a side wall of the block insulating layer 33a. The tunnel insulating layer 33c is formed with a certain thickness on a side wall of the charge storage layer 33b. The block insulating layer 33a and the tunnel insulating layer 33c are configured by silicon oxide ($SiO_2$). The charge storage layer 33b is configured by, for example, silicon nitride (SiN). The memory columnar semiconductor layer 34 is configured by polysilicon (poly-Si).

Expressing the above-described configuration of the memory layer 30 in other words, the word line conductive layers 31a-31e are formed to surround the memory columnar semiconductor layer 34 with the memory gate insulating layer 33 interposed therebetween.

The drain side select transistor layer 40 includes a drain side conductive layer 41, as shown in FIGS. 3, 4A, and 4B. The drain side conductive layer 41 functions as the gate of the drain side select transistor SDTr and as the drain side select gate line SGD.

The drain side conductive layer 41 is stacked on the memory layer 30 via an insulating layer. The drain side conductive layer 41 is formed directly above the memory columnar semiconductor layer 34. The drain side conductive layer 41 is formed in stripes in each of the memory blocks MB, the stripes extending in the row direction and having a certain pitch in the column direction. The drain side conductive layer 41 is configured by, for example, polysilicon (poly-Si) doped with an impurity.

In addition, as shown in FIGS. 4A and 4B, the drain side select transistor layer 40 includes a drain side hole 42. The drain side hole 42 is formed to penetrate the drain side conductive layer 41. The drain side holes 42 are formed in a matrix in the row direction and the column direction. The drain side hole 42 is formed at a position aligning with the memory hole 32.

Further, as shown in FIGS. 4A and 4B, the drain side select transistor layer 40 includes a drain side gate insulating layer 43 and a drain side columnar semiconductor layer 44. The drain side columnar semiconductor layer 44 functions as a body (channel) of the drain side select transistor SDTr.

The drain side gate insulating layer 43 is formed with a certain thickness on a side wall of the drain side hole 42. The drain side columnar semiconductor layer 44 is formed to be in contact with the drain side gate insulating layer 43 and to fill the drain side hole 42.

The drain side columnar semiconductor layer 44 is formed in a column shape to extend in the stacking direction. The drain side columnar semiconductor layer 44 is formed having its lower surface in contact with an upper surface of the memory columnar semiconductor layer 34. The drain side gate insulating layer 43 is configured by silicon oxide ($SiO_2$). The drain side columnar semiconductor layer 44 is configured by polysilicon (poly-Si).

Expressing the above-described configuration of the drain side select transistor layer 40 in other words, the drain side conductive layer 41 is formed to surround the drain side columnar semiconductor layer 44 with the drain side gate insulating layer 43 interposed therebetween.

The wiring layer 50 includes a bit layer 51, as shown in FIGS. 3, 4A, and 4B. The bit layer 51 functions as the bit line BL.

The bit layer 51 is formed to be in contact with an upper surface of the drain side columnar semiconductor layer 44. The bit layer 51 is formed extending in the column direction and having a certain pitch in the row direction. The bit layer 51 is configured by a metal such as tungsten.

Figure 6:
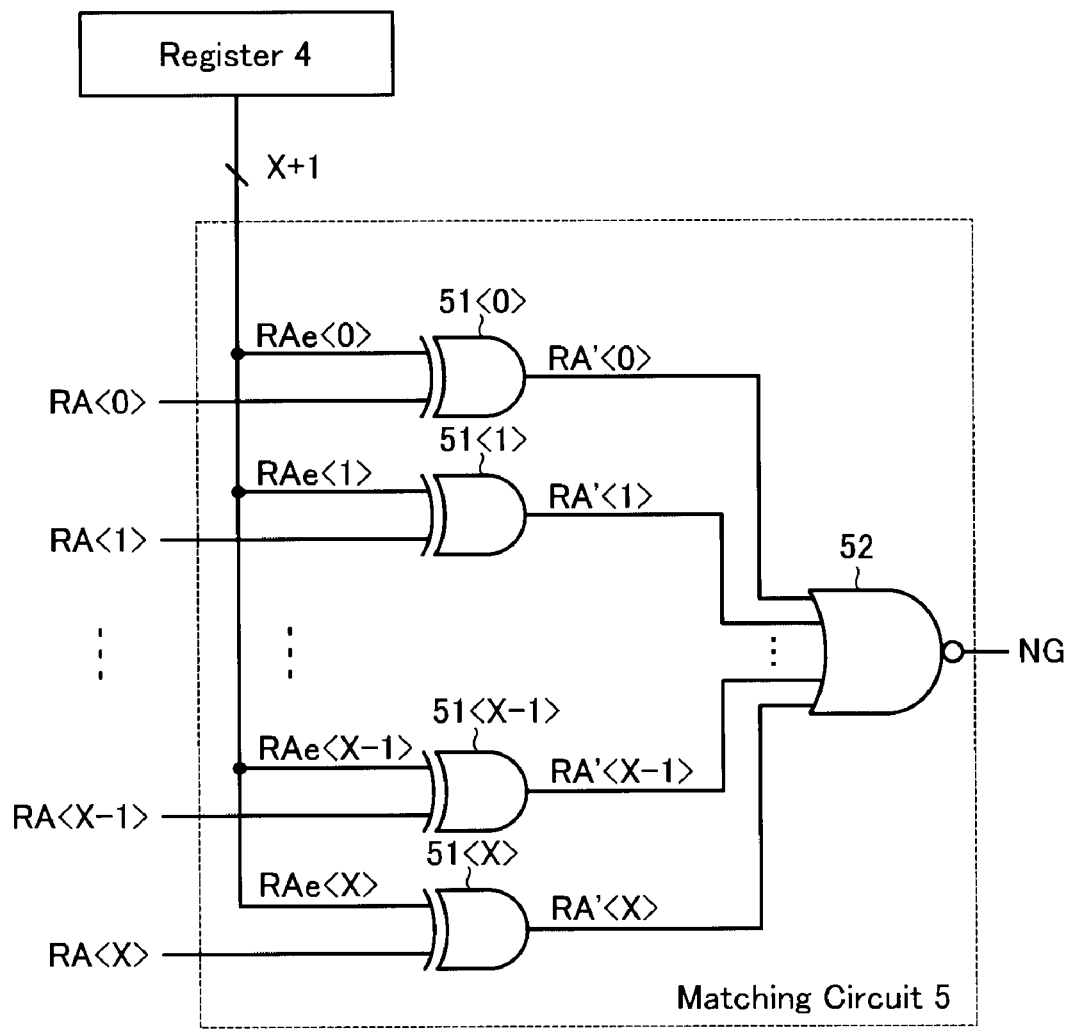
FIG. 6 is a circuit diagram of a matching circuit 5.

Next, a specific configuration of the matching circuit 5 is described with reference to FIG. 6. As shown in FIG. 6, the matching circuit 5 includes XOR circuits 51<0>-51<X> and one NOR circuit 52. The XOR circuits 51<0>-51<X> each have one of their input terminals receiving, respectively, the address signals RA<0>-RA<X>. The XOR circuits 51<0>-51<X> each have the other of their input terminals receiving, respectively, the defect address signals RAe<0>-RAe<X>. The XOR circuits 51<0>-51<X> each output, respectively, signals RA'<0>-RA'<X>, based on exclusive OR of the signals received at the input terminals. The NOR circuit 52 receives the signals RA'<0>-RA'<X> at its input terminals and outputs the matching signal NG based on negative OR of those received signals.

Figure 7:
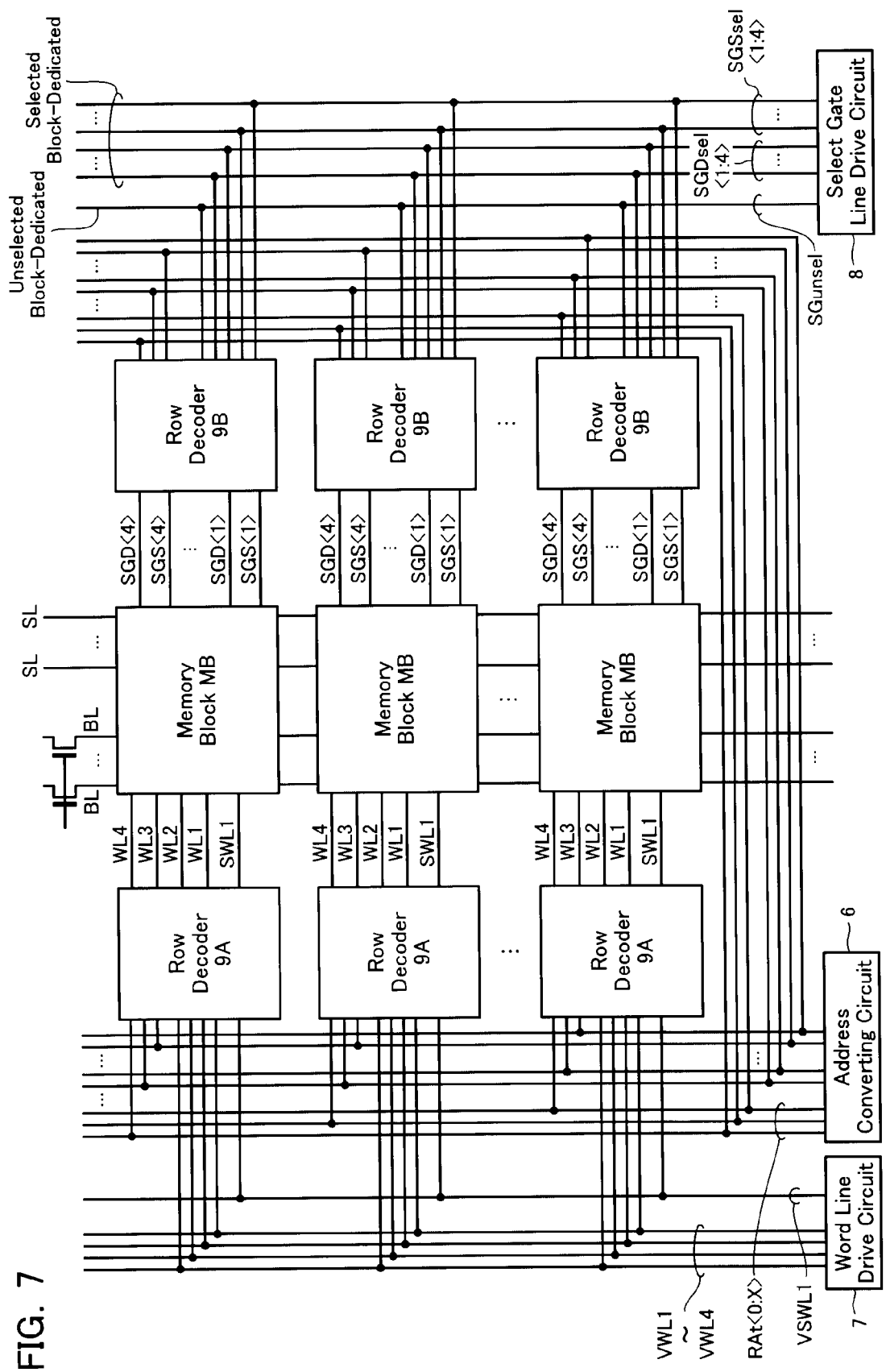
FIG. 7 is a view showing connection between an address converting circuit 6, a word line drive circuit 7, a select gate line drive circuit 8, and row decoders (9A, 9B).

Next, a specific configuration of the row decoders 9 is described with reference to FIG. 7. As shown in FIG. 7, there are two row decoders 9 provided to one memory block MB. Hereafter, a row decoder 9 positioned on the left side of a memory block MB shown in FIG. 7 is referred to as a row decoder 9A, and a row decoder 9 positioned on the right side of a memory block MB shown in FIG. 7 is referred to as a row decoder 9B.

Figure 8:
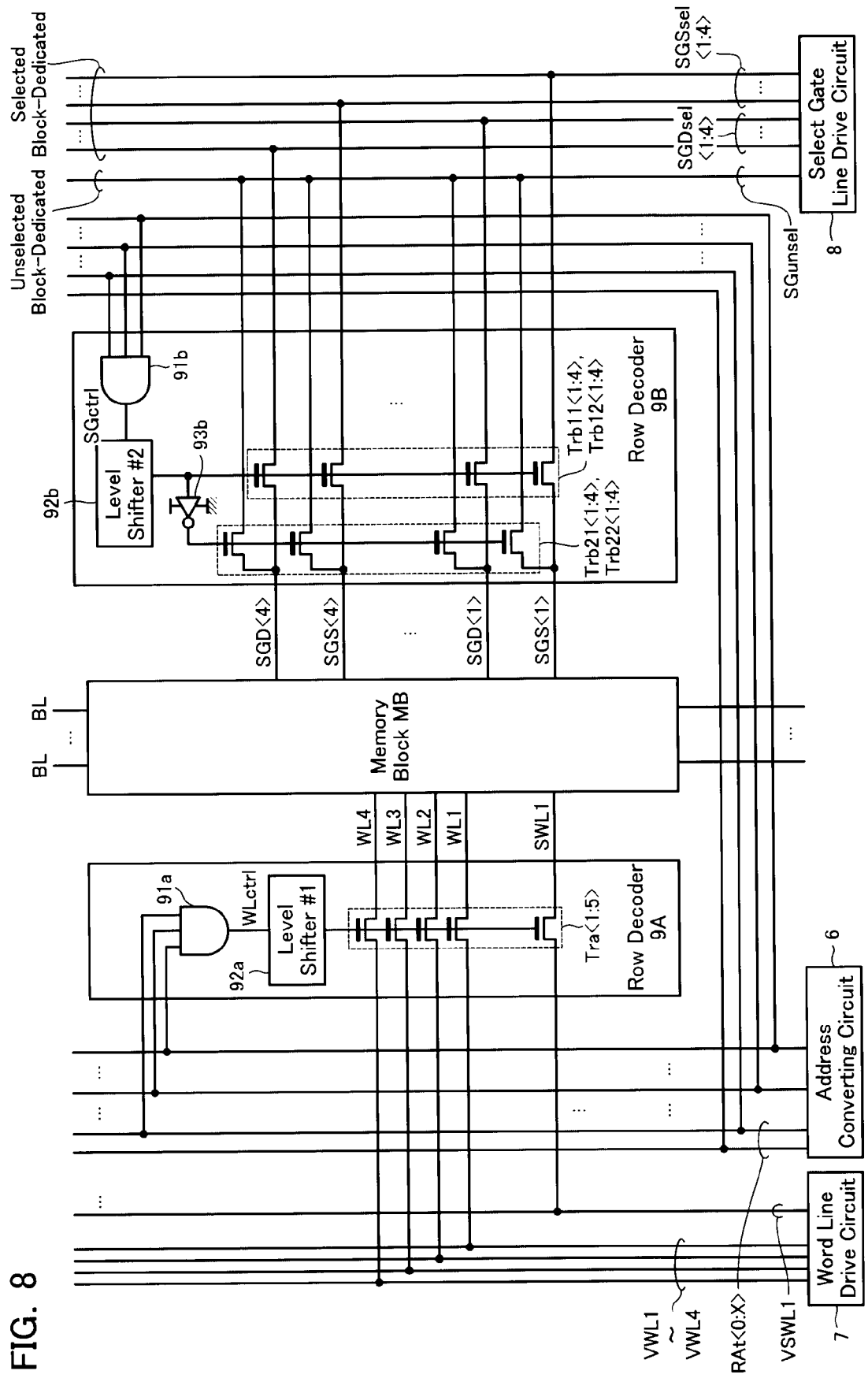
FIG. 8 is a circuit diagram of the row decoders (9A, 9B).

Next, configurations of the row decoders 9A and 9B are described with reference to FIG. 8, focusing on one memory block MB. As shown in FIG. 8, the row decoder 9A includes an AND circuit 91a, a level shifter 92a, and transfer transistors Tra<1>-Tra<5>.

The AND circuit 91a outputs a signal WLctrl based on the address signals RAt<0>-RAt<X> supplied from the address converting circuit 6. The transfer transistors Tra<1>-Tra<5> have their gates supplied with the signal WLctrl via the level shifter 92a.

The transfer transistor Tra<1> is provided between the spare word line SWL1 and the word line drive circuit 7. The transfer transistor Tra<1> transfers the voltage VSWL1 to the spare word line SWL1 based on the signal WLctrl.

The transfer transistors Tra<2>-Tra<5> are provided, respectively, between the word lines WL1-WL4 and the word line drive circuit 7. The transfer transistors Tra<2>-Tra<5> transfer, respectively, the voltages VWL1-VWL4 to the word lines WL1-WL4 based on the signal WLctrl.

As shown in FIG. 8, the row decoder 9B includes an AND circuit 91b, a level shifter 92b, an inverter 93b, first transfer transistors Trb11<1>-Trb11<4> and Trb12<1>-Trb12<4>, and second transfer transistors Trb21<1>-Trb21<4> and Trb22<1>-Trb22<4>.

The AND circuit 91b outputs a signal SGctrl based on the address signals RAt<0>-RAt<X> supplied from the address converting circuit 6. The first transfer transistors Trb11<1>-Trb11<4> and Trb12<1>-Trb12<4> have their gates supplied with the signal SGctrl via the level shifter 92b. On the other hand, the second transfer transistors Trb21<1>-Trb21<4> and Trb22<1>-Trb22<4> have their gates supplied with the signal SGctrl via the level shifter 92b and the inverter 93b.

The first transfer transistors Trb11<1>-Trb11<4> are provided, respectively, between the source side select gate lines SGS<1>-SGS<4> of the four columns in the memory block MB and the select gate line drive circuit 8. The first transfer transistors Trb11<1>-Trb11<4> transfer the voltages SGSsel<1>-SGSsel<4> to the source side select gate lines SGS<1>-SGS<4> included in a selected memory block MB based on the signal SGctrl.

The first transfer transistors Trb12<1>-Trb12<4> are provided, respectively, between the drain side select gate lines SGD<1>-SGD<4> of the four columns in the memory block MB and the select gate line drive circuit 8. The first transfer transistors Trb12<1>-Trb12<4> transfer the voltages SGDsel<1>-SGDsel<4> to the drain side select gate lines SGD<1>-SGD<4> included in a selected memory block MB based on the signal SGctrl.

The second transfer transistors Trb21<1>-Trb21<4> are provided, respectively, between the source side select gate lines SGS<1>-SGS<4> of the four columns in the memory block MB and the select gate line drive circuit 8. The second transfer transistors Trb21<1>-Trb21<4> transfer the voltage SGunsel to the source side select gate lines SGS<1>-SGS<4> included in an unselected memory block MB based on the signal SGctrl.

The second transfer transistors Trb22<1>-Trb22<4> are provided, respectively, between the drain side select gate lines SGD<1>-SGD<4> of the four columns in the memory block MB and the select gate line drive circuit 8. The second transfer transistors Trb22<1>-Trb22<4> transfer the voltage SGunsel to the drain side select gate lines SGD<1>-SGD<4> included in an unselected memory block MB based on the signal SGctrl.

As described above, the configurations shown in FIGS. 7 and 8 enable the row decoders 9 (9A, 9B) to apply a certain voltage to the word lines WL1-WL4, spare word line SWL, source side select gate lines SGS, and drain side select gate lines SGD in the memory block MB.

Figure 9:
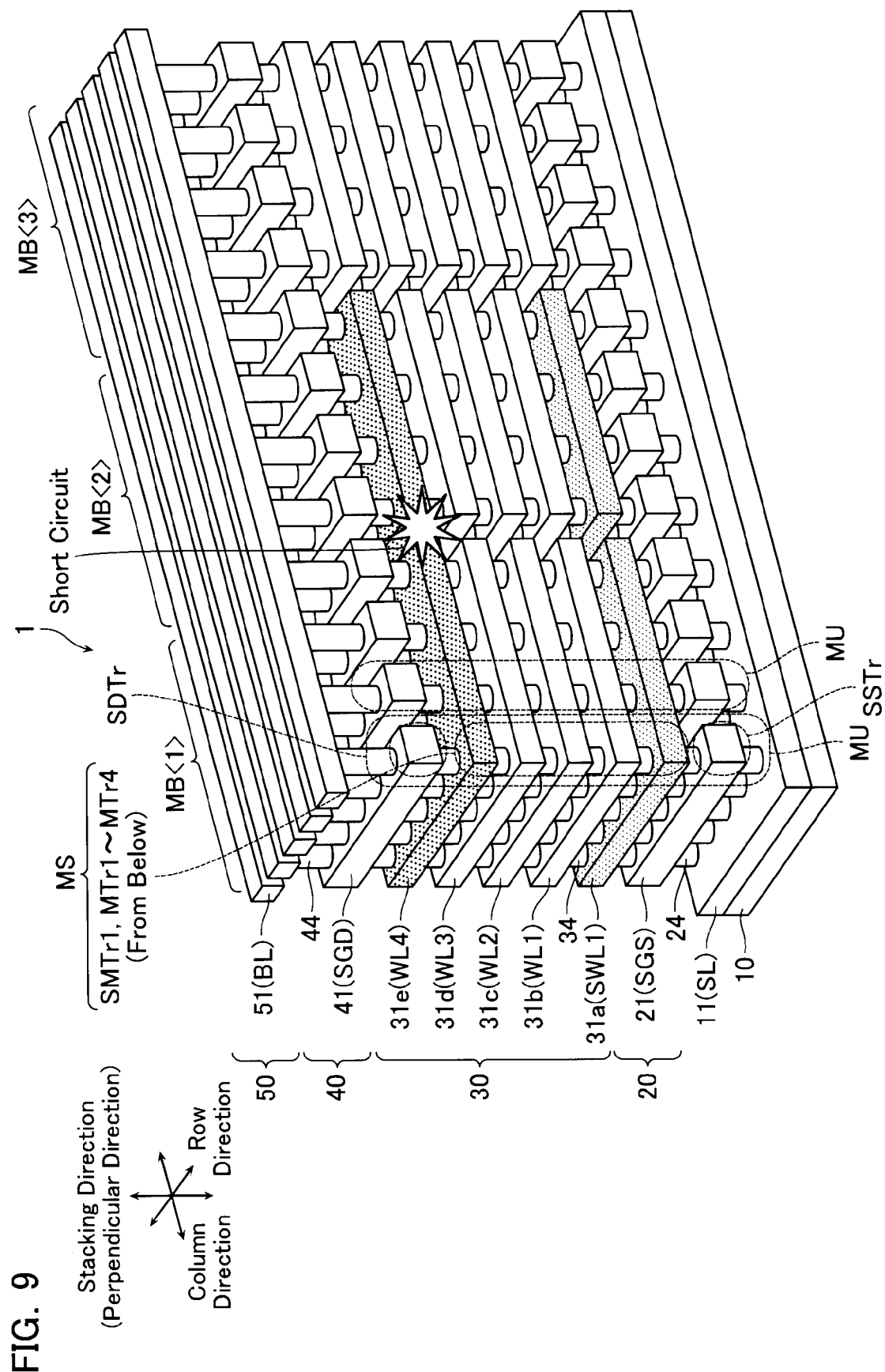
FIG. 9 is a view showing a short circuit of word line WL4 between memory blocks MB<1> and MB<2>.

Next, operation of the nonvolatile semiconductor memory device in accordance with the first embodiment is described with reference to FIG. 9. FIG. 9 shows an example where the word line WL4 is short-circuited between memory blocks MB<1> and MB<2>. The example shown in FIG. 9 results in all of the memory transistors MTr4 in memory blocks MB<1> and MB<2> being unable to be controlled.

Accordingly, the address converting circuit 6 outputs address signals RAt<0>-RAt<X> specifying the spare word line SWL1 in memory blocks MB<1> and MB<2>, based on address signals RA<0>-RA<X> specifying the word line WL4 in memory blocks MB<1> and MB<2>. This allows the first embodiment to drive the spare word line SWL1 (spare memory transistor SMTr1) in place of the word line WL4 (memory transistor MTr4). That is, the first embodiment allows the memory cell array 1 to be saved efficiently, in the case that the word lines WL1-WL4 short-circuit. Moreover, the first embodiment has the spare memory transistor SMTr1 and spare word line SWL1 disposed in a memory cell array 1 having a three-dimensional (spatial) structure. Consequently, in the first embodiment, in contrast to a memory cell array having a two-dimensional (planar) structure, the occupied area (chip area) of the memory cell array 1 does not increase, even if spare memory transistors are further added to the memory cell array 1.

[Second Embodiment]

Next, a nonvolatile semiconductor memory device in accordance with a second embodiment is described. Note that in the second embodiment, identical symbols are assigned to configurations similar to those of the first embodiment, and descriptions of such similar configurations are thus omitted.

Figure 10:
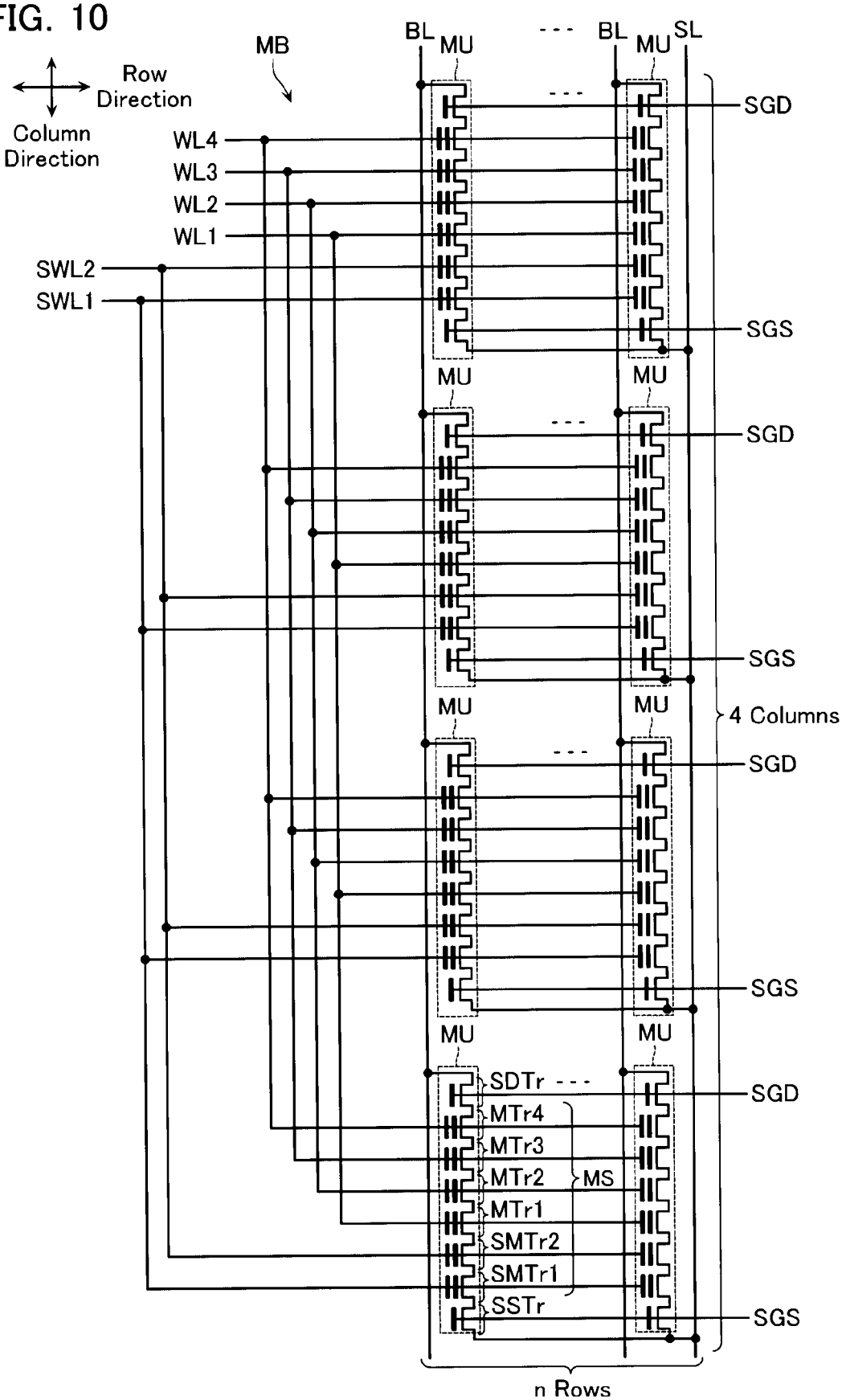
FIG. 10 is a circuit diagram of a memory cell block MB in accordance with a second embodiment.

First, a circuit configuration of a memory block MB in accordance with the second embodiment is described with reference to FIG. 10. As shown in FIG. 10, the memory string MS in accordance with the second embodiment further includes a spare memory transistor SMTr2 in addition to the configurations of the first embodiment. The spare memory transistor SMTr2 is provided between the spare memory transistor SMTr1 and the memory transistor MTr1.

The spare memory transistor SMTr2 functions similarly to the spare memory transistor SMTr1. One spare word line SWL2 is commonly connected to the gates of all of the spare memory transistors SMTr2 (nx4) in one memory block MB.

Next, a stacking structure of a memory cell array 1 in accordance with the second embodiment is described with reference to FIGS. 11A and 11B. The memory layer in accordance with the second embodiment further includes a word line conductive layer 31a' in addition to the configurations of the first embodiment. The word line conductive layer 31a' functions as a gate of the spare memory transistor SMTr2 and as the spare word line SWL2. Moreover, in the second embodiment, the memory columnar semiconductor layer 34 functions also as a body (channel) of the spare memory transistor SMTr2.

The word line conductive layer 31a' is provided between the word line conductive layer 31a and the word line conductive layer 31b with an insulating layer interposed therebetween. The word line conductive layer 31a' is divided on a memory block MB basis and formed in a plate-like shape extending in the row direction and the column direction. The word line conductive layer 31a' is formed to surround the memory columnar semiconductor layer 34 with the memory gate insulating layer 33 interposed therebetween. The word line conductive layer 31a' is configured by polysilicon doped with an impurity.

Figure 11A:
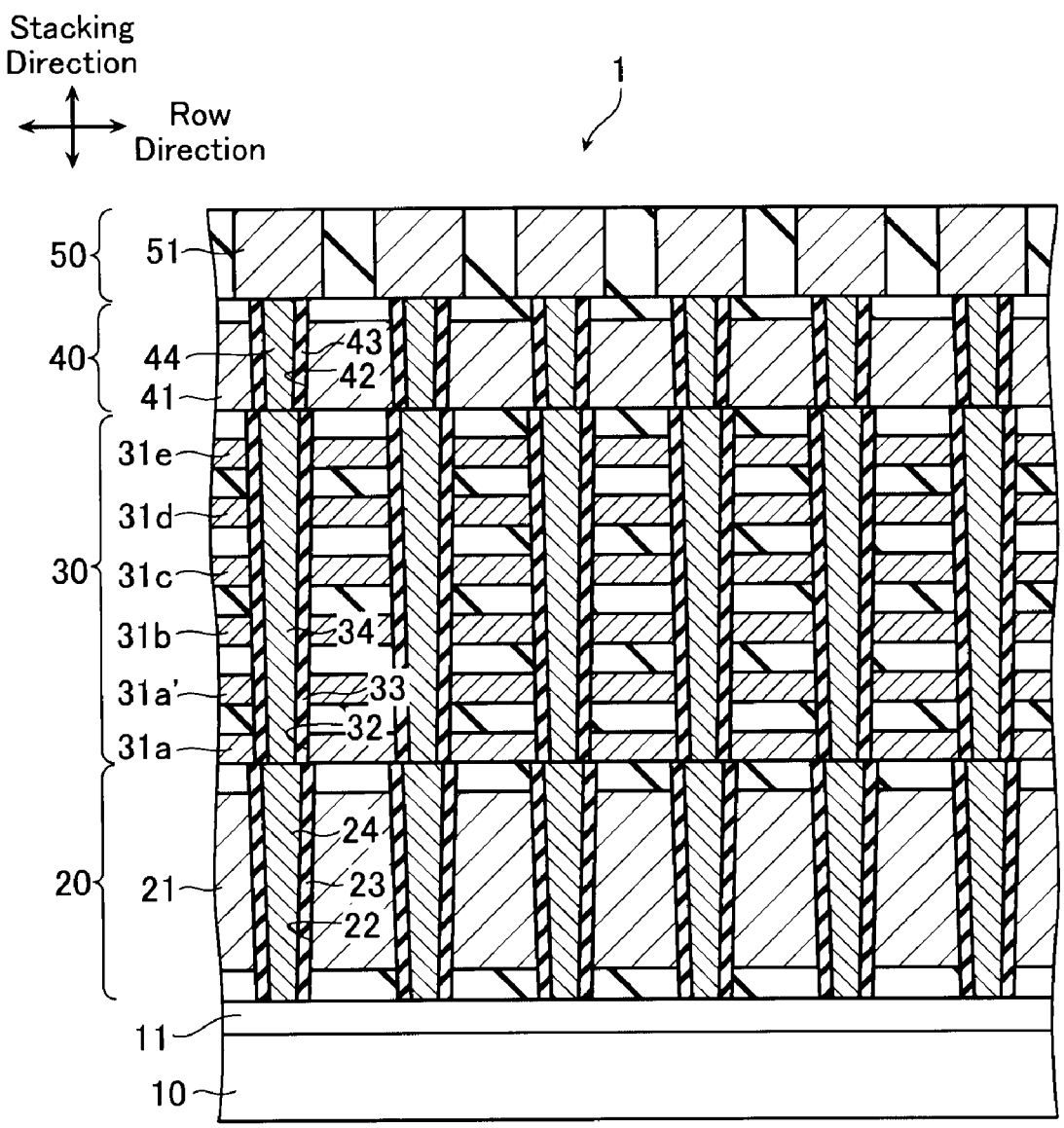
FIG. 11A is a cross-sectional view of a memory cell array 1 in accordance with the second embodiment.
Figure 11B:
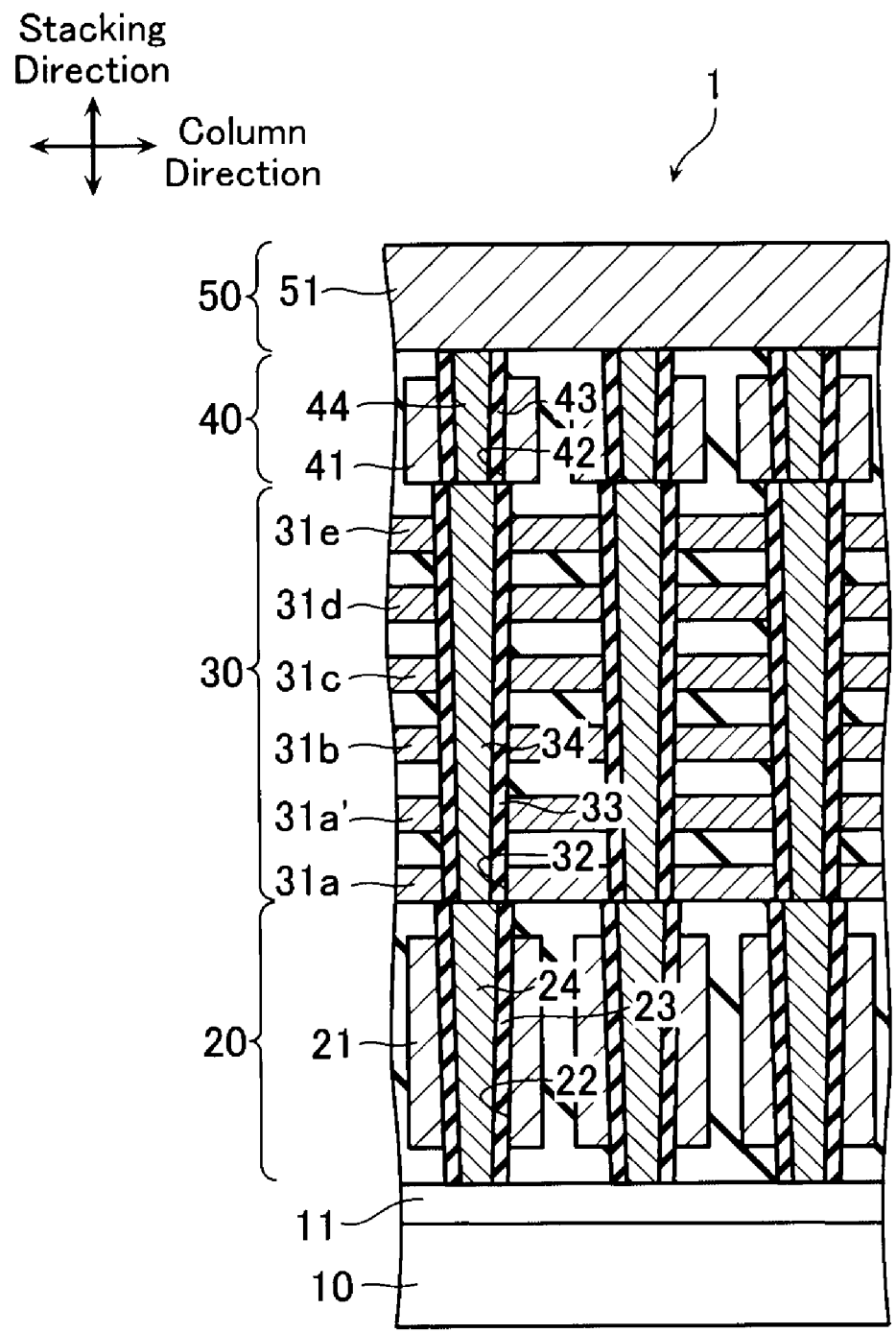
FIG. 11B is a cross-sectional view of the memory cell array 1 in accordance with the second embodiment.

The above-described configuration shown in FIGS. 10, 11A, and 11B allows the second embodiment to display similar advantages to the first embodiment. Moreover, when, for example, a short circuit occurs between the word line WL2 and WL3, that is, when two of the word lines WL1-WL4 (memory transistors MTr1-MTr4) are defective, the second embodiment allows the spare word lines SWL1 and SWL2 (spare memory transistors SMTr1 and SMTr2) to be driven in place of those defective word lines (memory transistors).

[Third Embodiment]

Next, a nonvolatile semiconductor memory device in accordance with a third embodiment is described with reference to FIG. 12. Note that in the third embodiment, identical symbols are assigned to configurations similar to those of the first and second embodiments, and descriptions of such similar configurations are thus omitted.

As mentioned above, the first embodiment is configured to drive the spare word line SWL1 in place of any one of the word lines WL1-WL4 judged to be defective. That is, the first embodiment is configured such that the spare word line SWL1 is not driven in place of word lines WL1-WL4 not judged to be defective. In contrast, the third embodiment allows the spare word line SWL1 to be driven in place of any one of the word lines WL1-WL4 regardless of whether it is defective or not.

Figure 12:
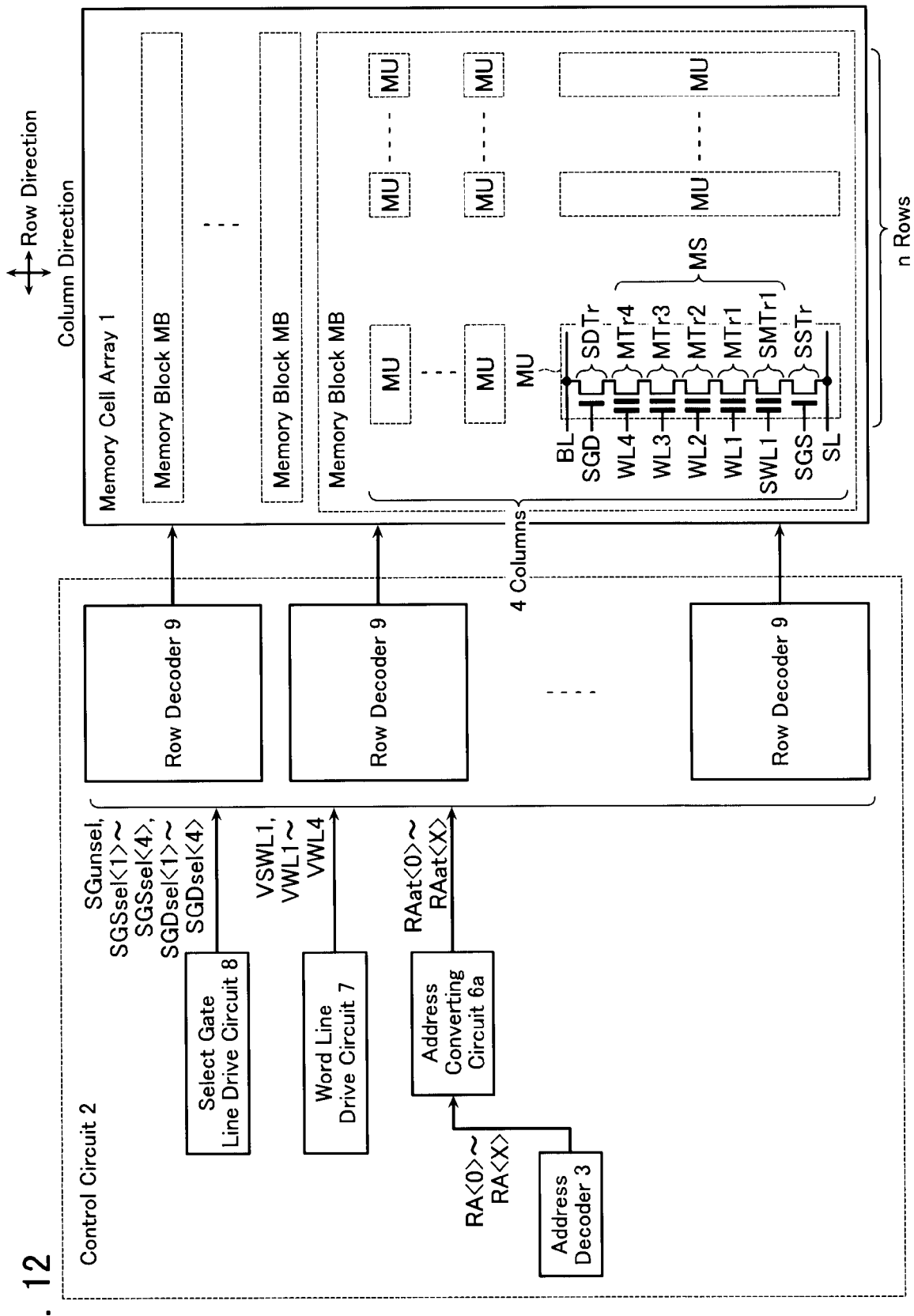
FIG. 12 is a block diagram of a nonvolatile semiconductor memory device in accordance with a third embodiment.

Consequently, as shown in FIG. 12, the third embodiment, in contrast to the first embodiment, does not include the register 4 and matching circuit 5. Further, the third embodiment includes an address converting circuit 6a having a different function to that of the address converting circuit in the first embodiment.

The address converting circuit 6a outputs address signals RAat<0>-RAat<X> to the row decoders 9 based on the address signals RA<0>-RA<X>. The address signals RAat<0>-RAat<X> include an address specifying the spare word line SWL1 to act as a substitute for selected word lines WL1-WL4. The above-described configuration allows the third embodiment to display similar advantages to the first embodiment.

[Fourth Embodiment]

Next, a nonvolatile semiconductor memory device in accordance with a fourth embodiment is described. Note that in the fourth embodiment, identical symbols are assigned to configurations similar to those of the first through third embodiments, and descriptions of such similar configurations are thus omitted.

Figure 13:
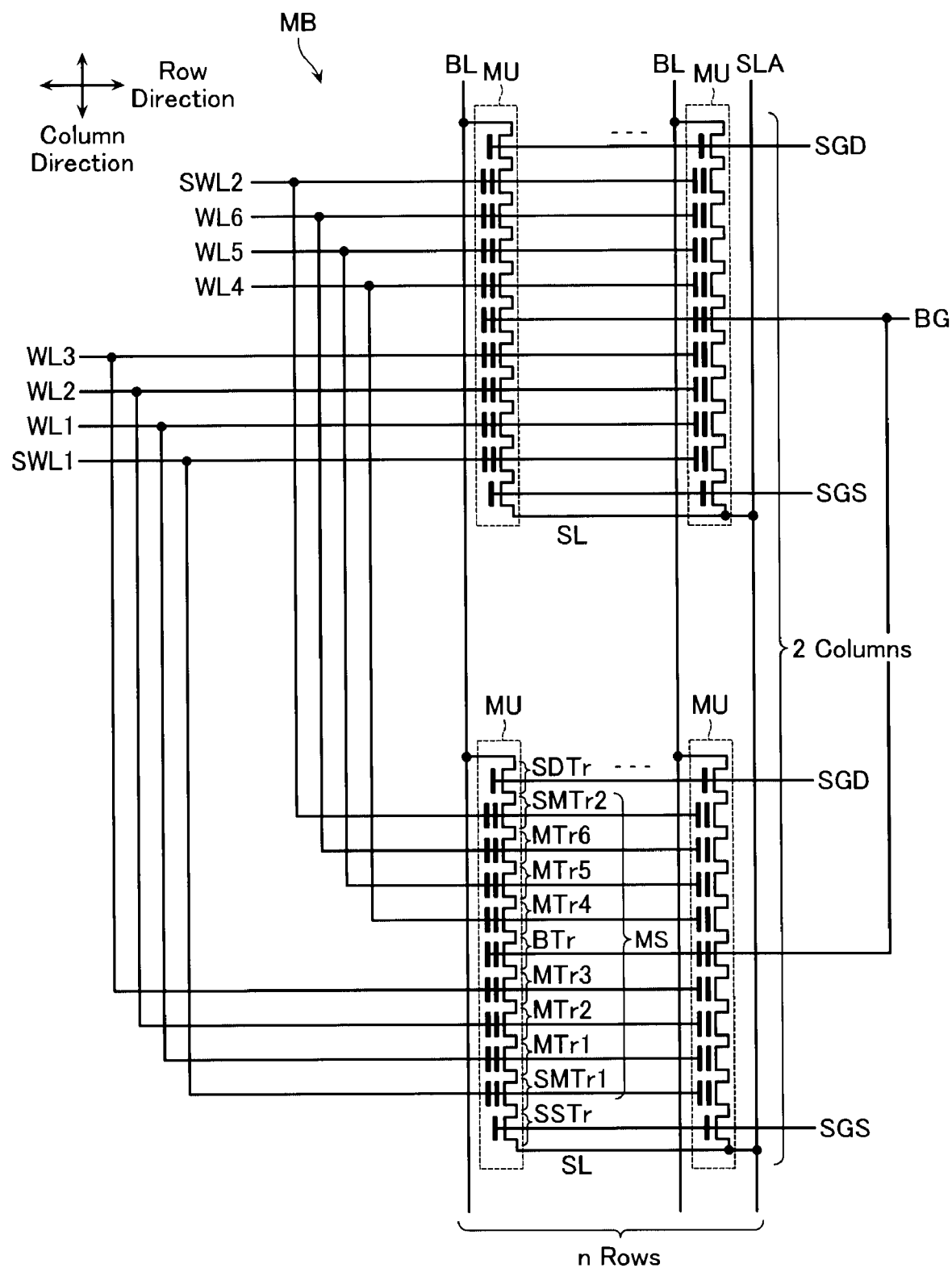
FIG. 13 is a circuit diagram of a memory cell block MB in accordance with a fourth embodiment.

First, a circuit configuration of a memory block MB in accordance with the fourth embodiment is described with reference to FIG. 13. As shown in FIG. 13, the memory string MS includes memory transistors MTr5 and MTr6, a spare memory transistor SMTr2, and a back gate transistor BTr, in addition to the configurations of the first embodiment. The memory transistors MTr1-MTr3 and the memory transistors MTr4-MTr6 are each connected in series. The spare memory transistor SMTr1 has its one end connected to the source of the memory transistor MTr1. The spare memory transistor SMTr2 has its one end connected to the drain of the memory transistor MTr6. The back gate transistor BTr is provided between the memory transistor MTr3 and the memory transistor MTr4.

The memory transistors MTr5 and MTr6 function similarly to the memory transistors MTr1-MTr4. A word line WL5 is commonly connected to gates of all of the memory transistors MTr5 (nx4) in one memory block MB. A word line WL6 is commonly connected to gates of all of the memory transistors MTr6 (nx4) in one memory block MB. The spare memory transistor SMTr2 functions similarly to the spare memory transistor SMTr1. One spare word line SWL2 is commonly connected to gates of all of the spare memory transistors SMTr2 (nx4) in one memory block MB. One back gate line BG is commonly connected to gates of all of the back gate transistors BTr (nx4) in one memory block MB.

Figure 14:
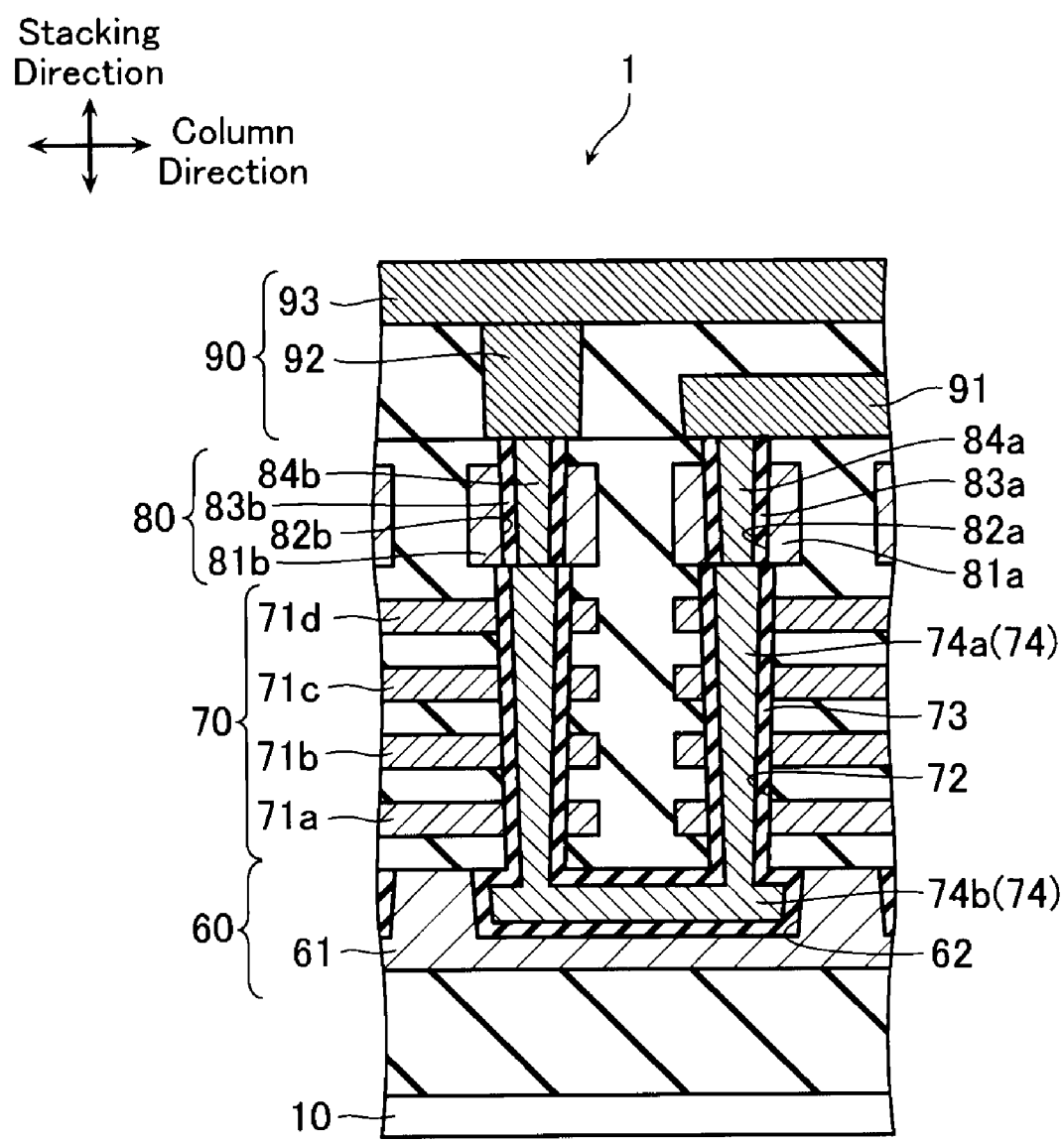
FIG. 14 is a cross-sectional view of a memory cell array 1 in accordance with the fourth embodiment.

Next, a stacking structure of a memory cell array 1 in accordance with the fourth embodiment is described with reference to FIG. 14. As shown in FIG. 14, the memory cell array 1 includes, stacked sequentially on the semiconductor substrate 10 with an insulating layer interposed therebetween, a back gate layer 60, a memory layer 70, a select transistor layer 80, and a wiring layer 90. The back gate layer 60 functions as the back gate transistor BTr. The memory layer 70 functions as the memory transistors MTr1-MTr6 and spare memory transistors SMTr1 and SMTr2. The select transistor layer 80 functions as the drain side select transistor SDTr and source side select transistor SSTr. The wiring layer 90 functions as the source line SL and the bit line BL.

The back gate layer 60 includes a back gate conductive layer 61, as shown in FIG. 14. The back gate conductive layer 61 functions as the back gate line BG and as a gate of the back gate transistor BTr. The back gate conductive layer 61 is formed extending two-dimensionally in the row direction and the column direction parallel to the substrate 10. The back gate conductive layer 61 is configured by polysilicon (poly-Si) doped with an impurity.

The back gate layer 60 includes a back gate hole 62, as shown in FIG. 14. The back gate hole 62 is formed to dig out the back gate conductive layer 61. The back gate hole 62 is formed in a substantially rectangular shape having the column direction as a long direction when viewed from above. The back gate holes 62 are formed in a matrix in the row direction and the column direction.

The memory layer 70 is formed in a layer above the back gate layer 60, as shown in FIG. 14. The memory layer 70 includes word line conductive layers 71a-71d. The word line conductive layer 71a functions as the word line WL3 and as the gate of the memory transistor MTr3. In addition, the word line conductive layer 71a functions as the word line WL4 and as the gate of the memory transistor MTr4. The word line conductive layer 71b functions as the word line WL2 and as the gate of the memory transistor MTr2. In addition, the word line conductive layer 71b functions as the word line WL5 and as the gate of the memory transistor MTr5. The word line conductive layer 71c functions as the word line WL1 and as the gate of the memory transistor MTr1. In addition, the word line conductive layer 71c functions as the word line WL6 and as the gate of the memory transistor MTr6. The word line conductive layer 71d functions as the spare word line SWL1 and as the gate of the spare memory transistor SMTr1. In addition, the word line conductive layer 71d functions as the spare word line SWL2 and as the gate of the spare memory transistor SMTr2.

The word line conductive layers are stacked sandwiching interlayer insulating layers. The word line conductive layers 71a-71d are formed extending with the row direction as a long direction and having a certain pitch in the column direction. The word line conductive layers 71a-71d are configured by polysilicon (poly-Si) doped with an impurity.

The memory layer 70 includes a memory hole 72, as shown in FIG. 14. The memory hole 72 is formed to penetrate the word line conductive layers 71a-71d and the insulating layers. The memory hole 72 is formed to align with a near vicinity of an end of the back gate hole 62 in the column direction.

Moreover, the back gate layer 60 and the memory layer 70 include a memory gate insulating layer 73 and a memory semiconductor layer 74, as shown in FIG. 14. The memory semiconductor layer 74 functions as a body (channel) of the memory string MS (memory transistors MTr1-MTr6 and spare memory transistors SMTr1 and SMTr2). The memory gate insulating layer 73 includes a charge storage layer configured to store a charge, similarly to the above-described embodiments.

The memory semiconductor layer 74 is formed to fill the back gate hole 62 and the memory hole 72. The memory semiconductor layer 74 is formed in a U shape as viewed from the row direction. The memory semiconductor layer 74 includes a pair of columnar portions 74a extending in the perpendicular direction with respect to the substrate 10, and a joining portion 74b configured to join lower ends of the pair of columnar portions 74a. The memory semiconductor layer 74 is configured by polysilicon (poly-Si).

Expressing the above-described configuration of the back gate layer 60 in other words, the back gate conductive layer 61 is formed to surround the joining portion 74b with the memory gate insulating layer 73 interposed therebetween. Moreover, expressing the above-described configuration of the memory layer 70 in other words, the word line conductive layers 71a-71d are formed to surround the columnar portions 74a with the memory gate insulating layer 73 interposed therebetween.

The select transistor layer 80 includes a source side conductive layer 81a and a drain side conductive layer 81b, as shown in FIG. 14. The source side conductive layer 81a functions as the source side select gate line SGS and as the gate of the source side select transistor SSTr. The drain side conductive layer 81b functions as the drain side select gate line SGD and as the gate of the drain side select transistor SDTr.

The source side conductive layer 81a is formed in a layer above one of the columnar portions 74a configuring the memory semiconductor layer 74. The drain side conductive layer 81b is in the same layer as the source side conductive layer 81a and formed in a layer above the other of the columnar portions 74a configuring the memory semiconductor layer 74. The source side conductive layer 81a and the drain side conductive layer 81b are formed in stripes extending in the row direction and having a certain pitch in the column direction. The source side conductive layer 81a and the drain side conductive layer 81b are configured by polysilicon (poly-Si) doped with an impurity.

The select transistor layer 80 includes a source side hole 82a and a drain side hole 82b, as shown in FIG. 14. The source side hole 82a is formed to penetrate the source side conductive layer 81a. The drain side hole 82b is formed to penetrate the drain side conductive layer 81b. The source side hole 82a and the drain side hole 82b are each formed at a position aligning with the memory hole 72.

The select transistor layer 80 includes a source side gate insulating layer 83a, a source side columnar semiconductor layer 84a, a drain side gate insulating layer 83b, and a drain side columnar semiconductor layer 84b, as shown in FIG. 14. The source side columnar semiconductor layer 84a functions as a body (channel) of the source side select transistor SSTr. The drain side columnar semiconductor layer 84b functions as a body (channel) of the drain side select transistor. SDTr.

The source side gate insulating layer 83a is formed with a certain thickness on a side surface of the source side hole 82a. The source side columnar semiconductor layer 84a is formed in a column shape to extend in the perpendicular direction with respect to the substrate 10 and to be in contact with a side surface of the source side gate insulating layer 83a and an upper surface of the one of the columnar portions 74a. The source side columnar semiconductor layer 84a is configured by polysilicon (poly-Si).

The drain side gate insulating layer 83b is formed with a certain thickness on a side surface of the drain side hole 82b. The drain side columnar semiconductor layer 84b is formed in a column shape to extend in the perpendicular direction with respect to the substrate 10 and to be in contact with a side surface of the drain side gate insulating layer 83b and an upper surface of the other of the columnar portions 74b. The drain side columnar semiconductor layer 84b is configured by polysilicon (poly-Si).

The wiring layer 90 includes a source layer 91, a plug layer 92, and a bit layer 93. The source layer 91 functions as the source line SL. The bit layer 93 functions as the bit line BL.

The source layer 91 is formed to extend in the row direction and to be in contact with an upper surface of the source side columnar semiconductor layer 84a. The bit layer 93 is formed to extend in the column direction and to be in contact with an upper surface of the drain side columnar semiconductor layer 84b via the plug layer 92. The source layer 91, the plug layer 92, and the bit layer 93 are configured by a metal such as tungsten.

The above-described configuration shown in FIGS. 13 and 14 enables the fourth embodiment to display similar advantages to the first embodiment. Moreover, when, for example, a short circuit occurs between the word line WL2 and the word line WL3, that is, when two of the word lines WL1-WL6 (memory transistors MTr1-MTr6) are defective, the fourth embodiment allows the spare word lines SWL1 and SWL2 (spare memory transistors SMTr1 and SMTr2) to be driven in place of those defective word lines (memory transistors). In addition, since the source line SL (source layer 91) is configured by a metal, the source line SL of the fourth embodiment has a lower resistance than that of the first embodiment. Furthermore, the fourth embodiment allows two spare word lines SWL1 and SWL2 and spare memory transistors SMTr1 and SMTr2 to be formed merely by formation of one word line conductive layer 71d.

[Other Embodiments]

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

For example, the first embodiment has one spare memory transistor SMTr1 in one memory string MS, and the second embodiment has two spare memory transistors SMTr1 and SMTr2 in one memory string MS. However, the first and second embodiments may have three or more spare memory transistors in one memory string MS.

Figure 15A:
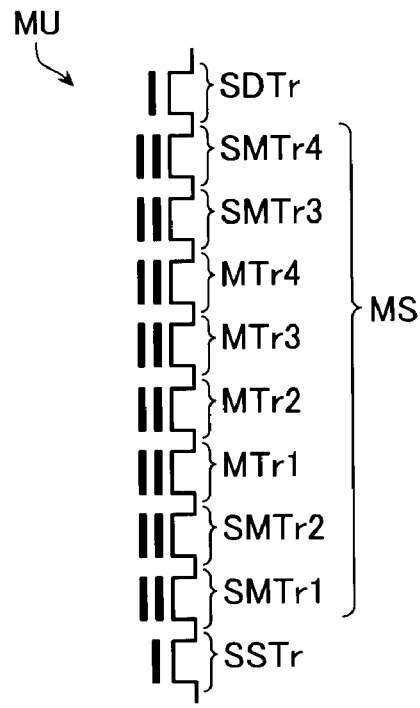
FIG. 15A is a circuit diagram showing a memory unit MU in accordance with another embodiment.
Figure 15B:
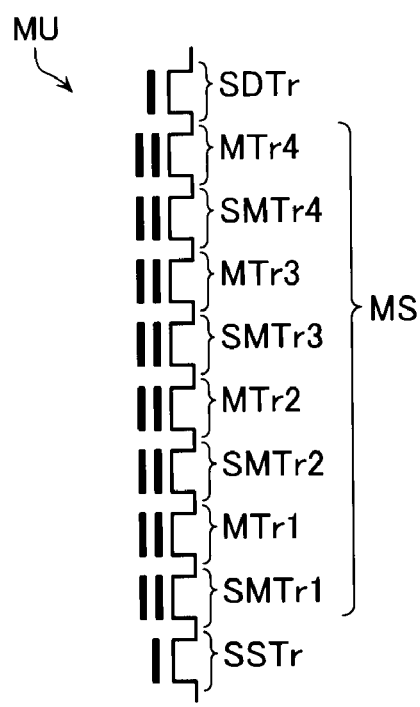
FIG. 15B is a circuit diagram showing a memory unit MU in accordance with another embodiment.

Moreover, in the above-described second embodiment, the spare memory transistors SMTr1 and SMTr2 are provided at one end of the series-connected memory transistors MTr1-MTr4. However, as shown in FIG. 15A, the second embodiment may further include the spare memory transistors SMTr3 and SMTr4, and have the spare memory transistors SMTr1-SMTr4 provided at both ends of the series-connected memory transistors MTr1-MTr4. In addition, as shown in FIG. 15B, the spare memory transistors SMTr1-SMTr4 may be provided between the memory transistors MTr1-MTr4.

What is claimed is:

1. A nonvolatile semiconductor memory device, comprising:
a memory string configured by a plurality of memory transistors and a spare memory transistor connected in series, the memory transistors and the spare memory transistor being electrically rewritable;
word lines connected to gates of the memory transistors;
a spare word line connected to a gate of the spare memory transistor; and
a control circuit configured to control a voltage supplied to the memory string,
the memory string comprising:
a first semiconductor layer extending in a perpendicular direction with respect to a substrate and configured to function as a body of the memory transistors and as a body of the spare memory transistor;
a charge storage layer formed to surround a side surface of the first semiconductor layer;
a plurality of first conductive layers formed to surround a side surface of the first semiconductor layer with the charge storage layer interposed therebetween, the first conductive layers being configured to function as the gates of the memory transistors and as the word lines; and
a second conductive layer formed to surround a side surface of the first semiconductor layer with the charge storage layer interposed therebetween, the second conductive layer being configured to function as the gate of the spare memory transistor and as the spare word line,
the control circuit being configured capable of driving the spare word line in place of the word lines.

2. The nonvolatile semiconductor memory device according to claim 1,
wherein a plurality of spare memory transistors are provided in the memory string, and a plurality of second conductive layers are provided.

3. The nonvolatile semiconductor memory device according to claim 1,
wherein the word lines are commonly connected to the gates of a plurality of the memory transistors included in a memory block, the memory block configuring a unit of erase,
wherein the spare word line is commonly connected to a plurality of the spare memory transistors included in the memory block,
wherein the first conductive layers are formed to surround a plurality of the first semiconductor layers and are divided on a memory block basis, and
wherein the second conductive layer is formed to surround a plurality of the first semiconductor layers and is divided on a memory block basis.

4. The nonvolatile semiconductor memory device according to claim 1, comprising:
a register configured to store a first address, the first address specifying one of the word lines judged to be defective;
a matching circuit configured to output a detection signal when the first address and a second address match, the second address specifying a selected one of the word lines;
an address converting circuit configured to output a third address based on the second address and the detection signal, the third address specifying the spare word line to act in place of the selected one of the word lines; and
a row decoder configured to drive the spare word line specified by the third address.

5. The nonvolatile semiconductor memory device according to claim 1, comprising:
an address converting circuit configured to output a first address and a second address, the first address specifying a selected one of the word lines, and the second address specifying the spare word line to act in place of the selected one of the word lines, the second address being outputted based on the first address; and
a row decoder configured to drive the spare word line specified by the second address.

6. The nonvolatile semiconductor memory device according to claim 1,
wherein the spare memory transistor is provided at one end of the series-connected memory transistors.

7. The nonvolatile semiconductor memory device according to claim 2,
wherein the spare memory transistors are provided at both ends of the series-connected memory transistors.

8. The nonvolatile semiconductor memory device according to claim 1,
wherein the spare memory transistor is provided between the memory transistors.

9. The nonvolatile semiconductor memory device according to claim 1, comprising:
a pair of columnar portions extending in the perpendicular direction with respect to the substrate; and
a joining portion configured to join lower ends of the pair of columnar portions.

10. The nonvolatile semiconductor memory device according to claim 1, comprising a first transistor having one end connected to one end of the memory string,
the first transistor comprising:
a second semiconductor layer extending in the perpendicular direction from a lower surface of the first semiconductor layer and configured to function as a body of the first transistor;
a first gate insulating layer configured to surround a side surface of the second semiconductor layer; and a third conductive layer surrounding the side surface of the second semiconductor layer with the first gate insulating layer interposed therebetween, the third conductive layer being configured to function as a gate of the first transistor.

11. The nonvolatile semiconductor memory device according to claim 10, comprising a second transistor having one end connected to the other end of the memory string, the second transistor comprising:
a third semiconductor layer extending in the perpendicular direction from an upper surface of the first semiconductor layer and configured to function as a body of the second transistor;
a second gate insulating layer configured to surround a side surface of the third semiconductor layer; and
a fourth conductive layer surrounding the side surface of the third semiconductor layer with the second gate insulating layer interposed therebetween, the fourth conductive layer being configured to function as a gate of the second transistor.

12. The nonvolatile semiconductor memory device according to claim 9, comprising a first transistor having one end connected to one end of the memory string, the first transistor comprising:
a second semiconductor layer extending in the perpendicular direction from an upper surface of one of a pair of first semiconductor layers and configured to function as a body of the first transistor;
a first gate insulating layer configured to surround a side surface of the second semiconductor layer; and
a third conductive layer surrounding the side surface of the second semiconductor layer with the first gate insulating layer interposed therebetween, the third conductive layer being configured to function as a gate of the first transistor.

13. The nonvolatile semiconductor memory device according to claim 12, comprising a second transistor having one end connected to the other end of the memory string, the second transistor comprising:
a third semiconductor layer extending in the perpendicular direction from an upper surface of the other of the pair of first semiconductor layers and configured to function as a body of the second transistor;
a second gate insulating layer configured to surround a side surface of the third semiconductor layer; and
a fourth conductive layer surrounding the side surface of the third semiconductor layer with the second gate insulating layer interposed therebetween, the fourth conductive layer being configured to function as a gate of the second transistor.

14. The nonvolatile semiconductor memory device according to claim 10, further comprising: a diffusion layer formed in a surface of the substrate and connected to a lower surface of the second semiconductor layer.

15. The nonvolatile semiconductor memory device according to claim 11, further comprising:
a wiring layer extending in a parallel direction with respect to the substrate and connected to an upper surface of the third semiconductor layer,
wherein the wiring layer is configured by a metal.

16. The nonvolatile semiconductor memory device according to claim 12, further comprising: a first wiring layer extending in a parallel direction with respect to the substrate and connected to an upper surface of the second semiconductor layer,
wherein the first wiring layer is configured by a metal.

17. The nonvolatile semiconductor memory device according to claim 13, further comprising:
a second wiring layer extending in a parallel direction with respect to the substrate and connected to an upper surface of the third semiconductor layer,
wherein the second wiring layer is configured by a metal.

18. The nonvolatile semiconductor memory device according to claim 1,
wherein, when the word lines adjacent in a parallel direction with respect to the substrate short-circuit, the control circuit drives the spare word line in place of the short-circuited word lines.

19. The nonvolatile semiconductor memory device according to claim 1,
wherein, when the word lines adjacent in the perpendicular direction with respect to the substrate short-circuit, the control circuit drives the spare word line in place of the short-circuited word lines.

20. The nonvolatile semiconductor memory device according to claim 4,
wherein the matching circuit comprises:
a plurality of XOR circuits configured to receive the first address and the second address; and
a NOR circuit configured to receive output signals from the plurality of XOR circuits and to output the detection signal.

* * * * *